US012455408B2

(12) United States Patent
Lee et al.

(10) Patent No.: US 12,455,408 B2
(45) Date of Patent: Oct. 28, 2025

(54) COLOR CONVERSION PANEL AND DISPLAY DEVICE INCLUDING THE SAME

(71) Applicant: Samsung Display Co., LTD., Yongin-si (KR)

(72) Inventors: Gak Seok Lee, Hwaseong-si (KR); Jieun Jang, Suwon-si (KR); Keunchan Oh, Hwaseong-si (KR); Sanghun Lee, Hwaseong-si (KR); Chang-Soon Jang, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 602 days.

(21) Appl. No.: 17/242,360

(22) Filed: Apr. 28, 2021

(65) Prior Publication Data

US 2022/0045132 A1 Feb. 10, 2022

(30) Foreign Application Priority Data

Aug. 5, 2020 (KR) .................. 10-2020-0098083

(51) Int. Cl.
*G02B 5/30* (2006.01)
*H10K 50/844* (2023.01)
(Continued)

(52) U.S. Cl.
CPC ......... *G02B 5/3033* (2013.01); *H10K 50/844* (2023.02); *H10K 50/854* (2023.02);
(Continued)

(58) Field of Classification Search
CPC .............. H01L 27/322; H01L 27/3211; H01L 51/5268; H01L 51/5262; H01L 51/5281;
(Continued)

(56) References Cited

U.S. PATENT DOCUMENTS 10,048,530 B1  8/2018 Kim et al.
10,411,224 B2  9/2019 Heo et al.
(Continued)

FOREIGN PATENT DOCUMENTS

EP  3339920 A1  6/2018
EP  3435149 A1  1/2019
(Continued)

OTHER PUBLICATIONS

English translation (Year: 2013).*
European Search Report for European Patent Application No. 21189499.3 dated Dec. 23, 2021.

*Primary Examiner* — William B Partridge
*Assistant Examiner* — David Paul Sedorook
(74) *Attorney, Agent, or Firm* — CANTOR COLBURN LLP

(57) ABSTRACT

A color conversion panel includes a plurality of pixel areas including a first pixel area and a second pixel area, and a non-pixel area which is adjacent to the first pixel area and the second pixel area, a light blocking layer in the non-pixel area, a color filter layer including a first color filter in the first pixel area and a second color filter in the second pixel area, a color conversion layer which color converts incident light, and scatters and reflects external light, the color conversion layer including a first color conversion pattern corresponding to the first color filter and a light transmission pattern corresponding to the second color filter, and a light absorbing layer which faces the color conversion layer and absorbs light which is scattered and reflected from the color conversion layer.

19 Claims, 8 Drawing Sheets

(51) Int. Cl.
  *H10K 50/854* (2023.01)
  *H10K 50/86* (2023.01)
  *H10K 59/12* (2023.01)
  *H10K 59/38* (2023.01)
  *H10K 59/80* (2023.01)
(52) U.S. Cl.
  CPC ............. *H10K 50/86* (2023.02); *H10K 59/38* (2023.02); *H10K 59/877* (2023.02); *H10K 59/8792* (2023.02); *H10K 59/12* (2023.02); *H10K 59/873* (2023.02)
(58) Field of Classification Search
  CPC ............. H01L 51/5284; H01L 27/3244; H01L 27/3225; H01L 27/3223; H10K 59/38; H10K 59/35; H10K 50/844; H10K 50/86; H10K 50/85; H10K 59/12
  See application file for complete search history.

(56) References Cited

U.S. PATENT DOCUMENTS

| | | | |
|---|---|---|---|
| 10,620,354 B2* | 4/2020 | Kong | G02B 5/3083 |
| 10,739,502 B2 | 8/2020 | Baek et al. | |
| 2004/0109111 A1* | 6/2004 | Ino | G02F 1/133555 |
| | | | 349/113 |
| 2005/0057708 A1* | 3/2005 | Kuo | G02F 1/133514 |
| | | | 349/106 |
| 2014/0118988 A1* | 5/2014 | Aoki | F21V 9/14 |
| | | | 362/19 |
| 2015/0205159 A1* | 7/2015 | Itou | G02F 1/133514 |
| | | | 349/110 |
| 2016/0322438 A1* | 11/2016 | Baek | H10K 59/38 |
| 2017/0076678 A1 | 3/2017 | Lee et al. | |
| 2017/0307932 A1* | 10/2017 | Lee | G02F 1/133512 |
| 2017/0329175 A1* | 11/2017 | Lee | G02F 1/133345 |
| 2018/0006093 A1* | 1/2018 | Kim | H01L 33/06 |
| 2018/0053918 A1* | 2/2018 | Woo | H10K 59/38 |
| 2018/0267210 A1 | 9/2018 | Takeuchi et al. | |
| 2019/0386253 A1* | 12/2019 | Li | H10K 59/38 |
| 2020/0147924 A1* | 5/2020 | Kim | B32B 27/40 |
| 2020/0363575 A1 | 11/2020 | Baek et al. | |

FOREIGN PATENT DOCUMENTS

| | | | | |
|---|---|---|---|---|
| EP | 3525037 A1 | 8/2019 | | |
| KR | 20170031613 A | 3/2017 | | |
| KR | 20180064616 A | 6/2018 | | |
| KR | 1020180126713 A | 11/2018 | | |
| KR | 1020190050144 A | 5/2019 | | |
| KR | 1020190083024 A | 7/2019 | | |
| KR | 20190097627 A | 8/2019 | | |
| WO | WO-2013039027 A1 * | 3/2013 | | G02F 1/1335 |

\* cited by examiner

COLOR CONVERSION PANEL AND DISPLAY DEVICE INCLUDING THE SAME

This application claims priority to Korean Patent Application No. 10-2020-0098083 filed on Aug. 5, 2020, and all the benefits accruing therefrom under 35 U.S.C. § 119, the entire disclosure of which is incorporated herein by reference.

BACKGROUND

1. Field

Embodiments relates to a display device. More particularly, embodiments relate to a display device including a display panel and a color conversion panel.

2. Description of the Related Art

The market for display devices serving as connection media between users and information is growing as information technology develops. Accordingly, flat panel displays such as organic light emitting displays and liquid crystal displays have been increasingly used.

Display devices including a color conversion panel have been proposed to implement a display device having excellent color gamut and high luminance.

SUMMARY

Embodiments provide a display device including a color conversion panel having an improved display quality.

A color conversion panel includes a plurality of pixel areas including a first pixel area and a second pixel area, and a non-pixel area which is adjacent to the first pixel area and the second pixel area, a light blocking layer in the non-pixel area, a color filter layer including a first color filter in the first pixel area and a second color filter in the second pixel area, a color conversion layer which color converts incident light, and scatters and reflects external light, the color conversion layer including a first color conversion pattern corresponding to the first color filter and a light transmission pattern corresponding to the second color filter, and a light absorbing layer which faces the color conversion layer and absorbs light which is scattered and reflected from the color conversion layer.

In an embodiment, the light absorbing layer may include in order from the color conversion layer a linearly polarizing layer, and a phase delay layer.

In an embodiment, the light absorbing layer may correspond to both the first pixel area and the second pixel area.

In an embodiment, the plurality of pixel areas may further include the first pixel area, a third pixel area and the second pixel area arranged in order along a first direction, and the first pixel area, the third pixel area and the second pixel area may include a red pixel area, a green pixel area and a blue pixel area, respectively.

In an embodiment, the light absorbing layer may correspond to the first pixel area including the red pixel area, and be spaced apart from each of the third pixel area including the green pixel area and the second pixel area including the blue pixel area along the first direction.

In an embodiment, light absorbing layer may correspond to the third pixel area including the green pixel area, and be spaced apart from the first pixel area including the red pixel area and the second pixel area including the blue pixel area along the first direction.

In an embodiment, the light absorbing layer may correspond to both the first pixel area including the red pixel area and the third pixel area including the green pixel area, and be spaced apart from the second pixel area including the blue pixel area along the first direction.

In an embodiment, the light absorbing layer may have a degree of polarization of about 10% to about 99.9%.

In an embodiment, the light absorbing layer may have a thickness of about 2 micrometers ($\mu$m) to about 10 $\mu$m.

In an embodiment, the light blocking layer may include a same material as a material of the second color filter which corresponds to the light transmission pattern.

A display device includes a plurality of pixel areas including a first pixel area and a second pixel area, and a non-pixel area which is adjacent to the first pixel area and the second pixel area, a light emitting device in each of the first pixel area and the second pixel area, a color conversion layer which color converts incident light, and scatters and reflects external light, the color conversion layer including a first color conversion pattern corresponding to the first pixel area and a light transmission pattern corresponding to the second pixel area, a color filter layer including a first color filter corresponding to the first color conversion pattern and a second color filter corresponding to the light transmission pattern, a light blocking layer in the non-pixel area, and a light absorbing layer which is between the light emitting device and the color conversion layer and absorbs light scattered and reflected from the color conversion layer.

In an embodiment, the scattering absorption layer may include order from the light emitting device to the color conversion layer a phase delay layer and a linearly polarizing layer.

In an embodiment, a filling layer may be between the light emitting device and the color conversion layer and combine the light emitting device to the color conversion layer, and the light absorbing layer may be disposed between the filling layer and the color conversion layer.

In an embodiment, a filling layer may be between the light emitting device and the color conversion layer and combine the light emitting device to the color conversion layer, a thin film encapsulation layer may be between the filling layer and the light emitting device, and the light absorbing layer may be between the thin film encapsulation layer and the filling layer.

In an embodiment, a thin film encapsulation layer may be between the light emitting device and the color conversion layer, and the light absorbing layer may be between the light emitting device and the thin film encapsulation layer.

In an embodiment, the light absorbing layer may correspond to both the first pixel area corresponding to the first color conversion pattern and the second pixel area corresponding to the light transmission pattern.

In an embodiment, the plurality of pixel areas may further include the first pixel area, a third pixel area and the second pixel area arranged in order along a first direction, and the first pixel area, the third pixel area and the second pixel area may include a red pixel area, a green pixel area and a blue pixel area, respectively.

In an embodiment, the light absorbing layer may correspond to the first pixel area including the red pixel area, and be spaced apart from each of the third pixel area including the green pixel area and the second pixel area including the blue pixel area along the first direction.

In an embodiment, the light absorbing layer may correspond to the third pixel area including the green pixel area, and be spaced apart from the first pixel area including the red pixel area and the second pixel area including the blue pixel area along the first direction.

In an embodiment, the light absorbing layer may correspond to both the first pixel area including the red pixel area and the third pixel area including the green pixel area, and be spaced apart from the second pixel area including the blue pixel area along the first direction.

In one or more embodiment of the display device, the scattering absorption layer (e.g., light absorbing layer) between the color conversion layer of the color conversion panel and the light emitting device of the display panel may absorb external light scattered and reflected from the color conversion layer, so that the reflection of external light in the display device may be reduced and the display quality of the display device may be improved.

BRIEF DESCRIPTION OF THE DRAWINGS

Illustrative, embodiments will be more clearly understood from the following detailed description taken in conjunction with the accompanying drawings.

DETAILED DESCRIPTION

Figure 1:
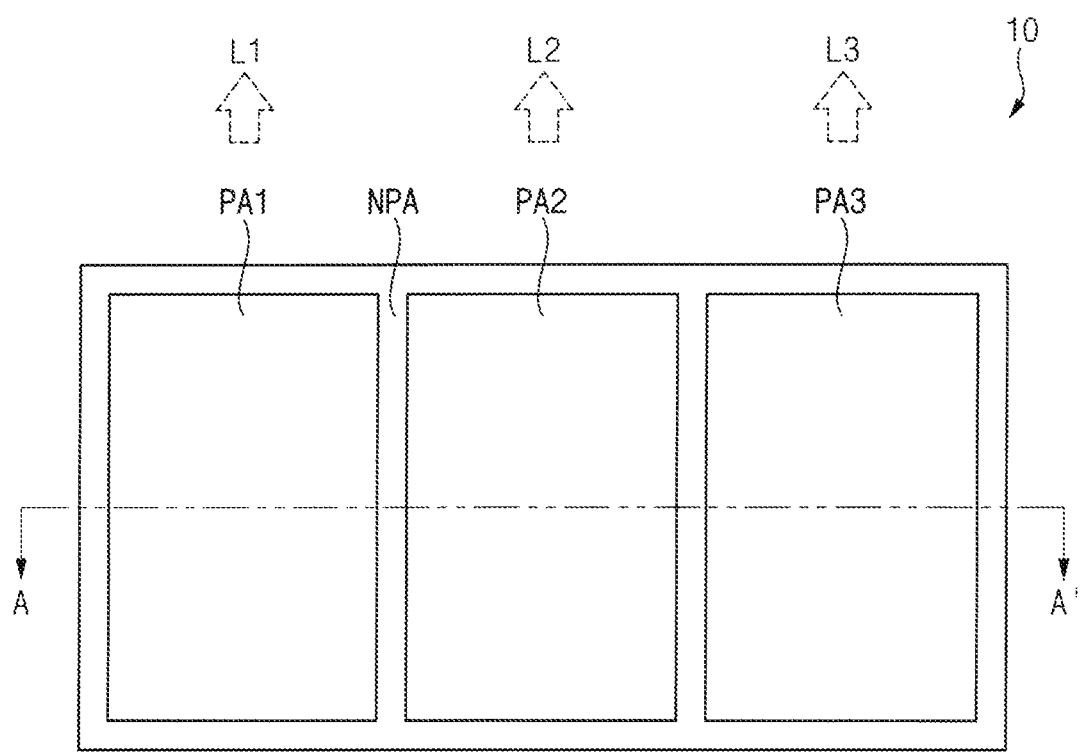
FIG. 1 is a plan view showing an embodiment of a display device.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being related to another element such as being "on" another element, it can be directly on the other element or intervening elements may be present therebetween. In contrast, when an element is referred to as being related to another element such as "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In a conventional display device including a conventional color conversion panel, light incident to the conventional color conversion panel from outside the conventional display device may be reflected by quantum dots or scattering bodies included in the conventional color conversion panel. As a result, the reflected external light may be recognized from outside the conventional display device which deteriorates the display quality of the conventional display device.

Hereinafter, embodiments of the invention will be explained in detail with reference to the accompanying drawings.

FIG. 1 is a plan view showing an embodiment of a display device 10.

Referring to FIG. 1, the display device 10 may include a first pixel area PA1, a second pixel area PA2, a third pixel area PA3 and a non-pixel area NPA. The display device 10 may include a plurality of pixel areas including the first pixel area PA1, the second pixel area PA2 and the third pixel area PA3 at which an image is displayed, light is generated, light is emitted, etc., without being limited thereto. The first pixel area PA1, the second pixel area PA2 and the third pixel area PA3 may be arranged in order along a first direction.

The first pixel area PA1 may emit first light L1 of a first color, the second pixel area PA2 may emit second light L2 of a second color and the third pixel area PA3 may emit third light L3 of a third color. In an embodiment, the first color may be red, the second color may be green and the third color may be blue. The first pixel area PA1 may be a red pixel area, the second pixel area PA2 may be a green pixel area and the third pixel area PA3 may be a blue pixel area.

The first pixel area PA1, the second pixel area PA2 and the third pixel area PA3 may together form one pixel area. The pixel area may emit a light including the first light L1, the second light L2 and the third light L3 which are combined.

The non-pixel area NPA may be positioned respectively between the first pixel area PA1, the second pixel area PA2 and the third pixel area PA3. The non-pixel area NPA may be adjacent to each of the first pixel area PA1, the second pixel area PA2 and the third pixel area PA3. In an embodiment, for example, the non-pixel area NPA may surround the first pixel area PA1, the second pixel area PA2 and the third pixel area PA3, when viewed in a plan view. The non-pixel area NPA may be a planar area at which an image is not displayed, light is not generated, light is not emitted, etc., without being limited thereto.

Figure 2:
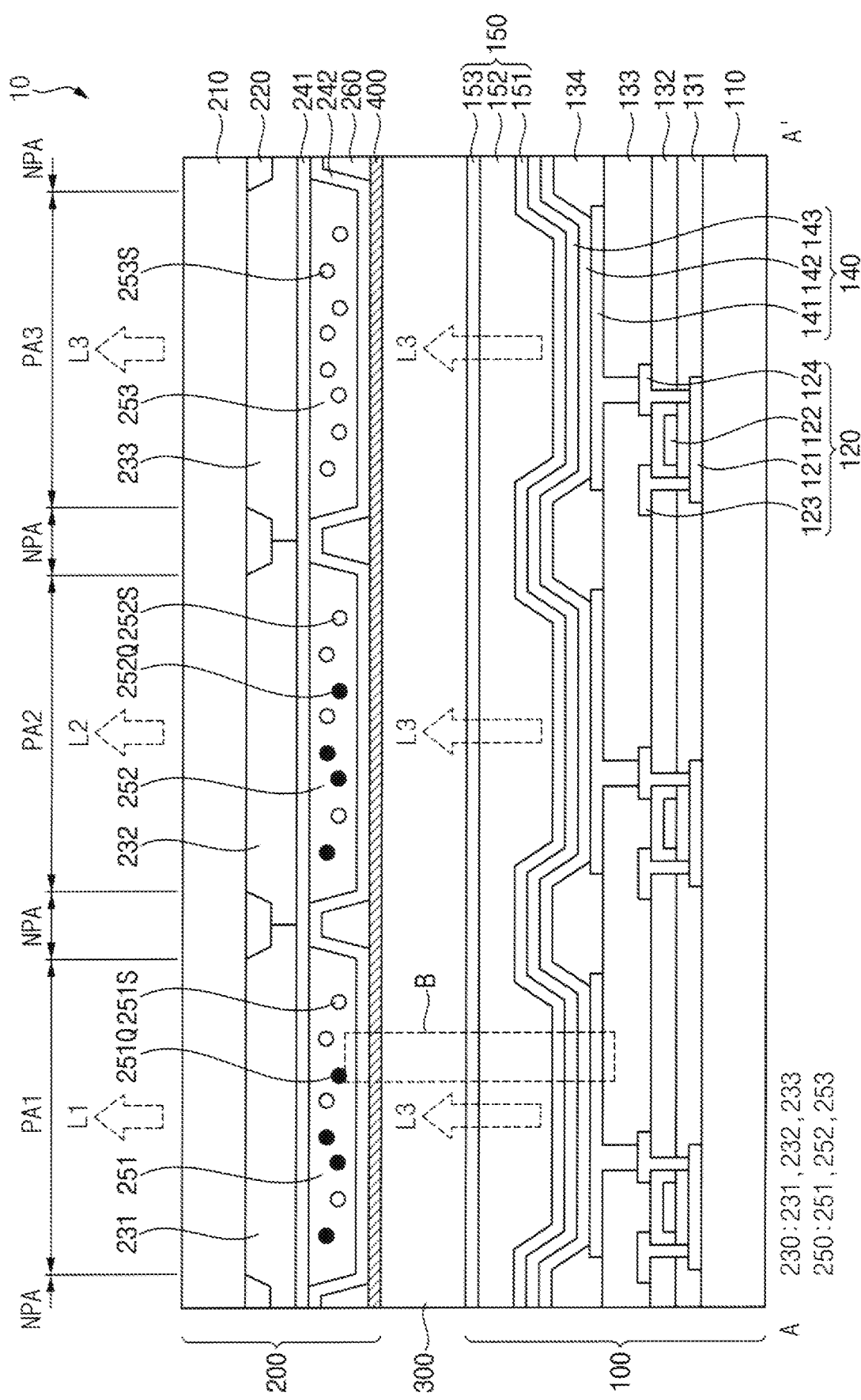
FIG. 2 is a cross-sectional view taken along line A-A' of FIG. 1.
Figure 3:
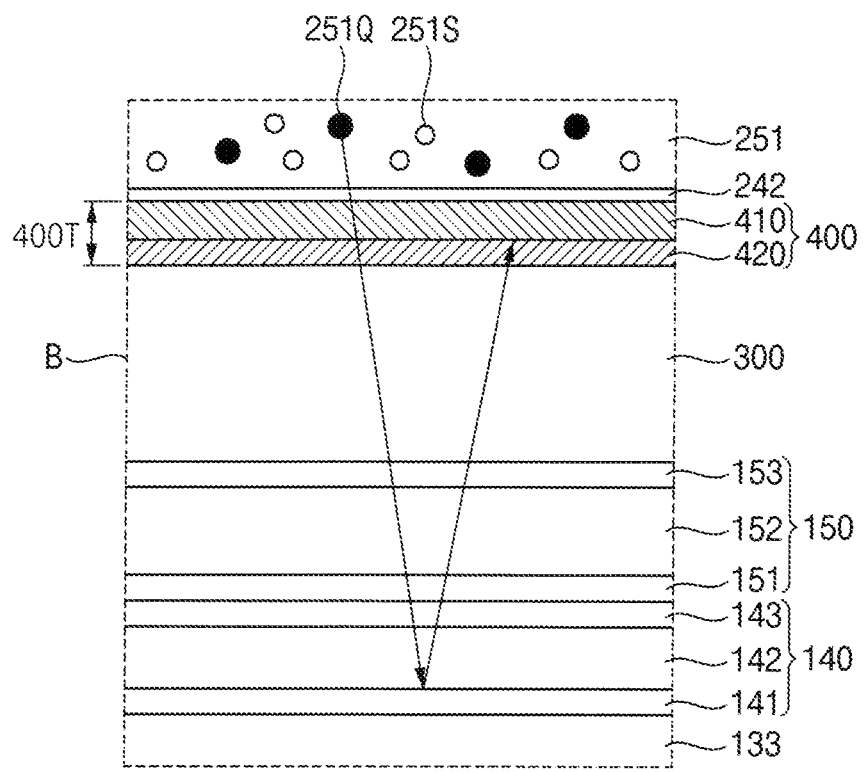
FIG. 3 is an enlarged cross-sectional view showing area B of FIG. 2.

FIG. 2 is a cross-sectional view taken along line A-A' of FIG. 1. FIG. 3 is an enlarged cross-sectional view showing an embodiment of area B of FIG. 2.

Referring to FIGS. 2 and 3, the display device 10 may include a display panel 100, a color conversion panel 200 facing the display panel 100, a filling layer 300, and a scattering absorption layer 400 (e.g., light absorbing layer). In an embodiment, the scattering absorption layer 400 may be considered a portion of the color conversion panel 200, without being limited thereto.

The display panel 100 may generate and/or provide light having one color to the color conversion panel 200. In an embodiment, the display panel 100 may provide the third light L3 as incident light to the color conversion panel 200. The display panel 100 may include a first substrate 110, a transistor 120, a light emitting device 140 and a thin film encapsulation layer 150.

The first substrate 110 may be a transparent or opaque insulating substrate. In an embodiment, the first substrate 110 may include glass, quartz and the like. In an embodiment, the first substrate 110 may include an organic insulating material such as polyimide, polycarbonate, polyethylene terephthalate and polyacrylate.

An active pattern 121 of the transistor 120 may be disposed on the first substrate 110. In an embodiment, the active pattern 121 may include amorphous silicon, polycrystalline silicon, and the like. In an embodiment, the active pattern 121 may include an oxide semiconductor.

A gate insulating layer 131 may be disposed on the first substrate 110, and cover the active pattern 121. The gate insulating layer 131 may include an inorganic insulating material such as silicon oxide, silicon nitride and silicon oxynitride.

A gate electrode 122 of the transistor 120 may be disposed on the gate insulating layer 131, and overlap or correspond to the active pattern 121. The gate electrode 122 may include a conductive material such as copper (Cu), molybdenum (Mo), titanium (Ti) and aluminum (Al).

An interlayer insulating layer 132 may be disposed on the gate insulating layer 131, and cover the gate electrode 122. The interlayer insulating layer 132 may include an inorganic insulating material such as silicon oxide, silicon nitride and silicon oxynitride.

A source electrode 123 and a drain electrode 124 of the transistor 120 may be disposed on the interlayer insulating layer 132 and connected to the active pattern 121. The source electrode 123 and the drain electrode 124 may include a conductive material such as copper (Cu), molybdenum (Mo), titanium (Ti and aluminum (Al).

The active pattern 121, the gate electrode 122, the source electrode 123 and the drain electrode 124 may form the transistor 120. A transistor 120 may be disposed in each of the first pixel area PA1, the second pixel area PA2 and the third pixel area PA3.

A planarization layer 133 may be disposed on the interlayer insulating layer 132, and cover the source electrode 123 and the drain electrode 124. The planarization layer 133 may include an inorganic insulating material such as silicon oxide, silicon nitride and silicon oxynitride, and/or an organic insulating material such as acryl-based resin, epoxy-based resin, phenol-based resin, polyamide-based resin, polyimide-based resin, unsaturated polyester-based resin, polyphenylene-based resin, polyphenylene-based sulfide resin and benzocyclobutene.

A pixel electrode 141 (e.g., first electrode) of the light emitting device 140 may be disposed on the planarization layer 133, and connected to the transistor 120 such as at the drain electrode 124. The pixel electrode 141 may include a transparent conductive layer including a transparent conductive material such as indium-tin-oxide ("ITO"), indium-zinc-oxide ("IZO"), zinc oxide (ZnO), indium oxide (In2O3) and the like, and/or a reflective conductive layer including a reflective conductive material such as silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca) and the like. In an embodiment, the pixel electrode 141 may have a stacked or laminated structure of ITO, Ag, and ITO. In an embodiment, the pixel electrode 141 may be a reflective electrode.

A pixel defining layer 134 may be disposed on the planarization layer 133, and cover at least a part of the pixel electrode 141. In an embodiment, the pixel defining layer 134 may cover a periphery or outer edge of the pixel electrode 141. The pixel defining layer 134 may define a pixel opening which exposes a portion of the pixel electrode 141 to outside the pixel defining layer 134, such as at a central portion of the pixel electrode 141. The pixel defining layer 134 may include an inorganic insulating material such as silicon oxide, silicon nitride and silicon oxynitride, and/or an organic insulating material such as acryl-based resin, epoxy-based resin, phenol-based resin, polyamide-based resin, polyimide-based resin, unsaturated polyester-based resin, polyphenylene-based resin, polyphenylene-based sulfide resin and benzocyclobutene.

A light emitting layer 142 of the light emitting device 140 may be disposed on the pixel electrode 141 which is exposed at the pixel opening and on the pixel defining layer 134. Holes provided from the pixel electrode 141 and electrons provided from a counter electrode 143 of the light emitting device 140 may be combined in the light emitting layer 142 to form excitons, and the light emitting layer 142 may emit light while the excitons are converted from an excited state to a ground state. In an embodiment, the light emitting layer 142 may emit the third light L3 as the light incident to the color conversion panel 200.

The counter electrode 143 (e.g., second electrode) may be disposed on the light emitting layer 142. That is, the light emitting device 140 includes a first electrode which faces a second electrode with a light emitting layer 142 therebetween. The counter electrode 143 may include a transparent conductive layer including a transparent conductive material such as lithium (Li), calcium (Ca), aluminum (Al), magnesium (Mg), silver (Ag), platinum (Pt), lead (Pb), nickel (Ni), gold (Au), neodymium (Nd), iridium (Ir), chromium (Cr), barium (Ba) and the like. In an embodiment, the counter electrode 143 may be a transmission electrode.

The pixel electrode 141, the light emitting layer 142 and the counter electrode 143 may together form the light emitting device 140. A light emitting device 140 may be disposed in each of the first pixel area PA1, the second pixel area PA2 and the third pixel area PA3. The first pixel area PA1, the second pixel area PA2 and the third pixel area PA3 individually or together as a pixel area may be referred to as a light emitting area of the display device 10.

The thin film encapsulation layer 150 may be disposed on the counter electrode 143. The thin film encapsulation layer 150 may reduce or effectively prevent impurities, moisture and the like from permeating the light emitting device 140 from outside thereof. The thin film encapsulation layer 150 may include at least one inorganic encapsulation layer and at least one organic encapsulation layer. In an embodiment, the thin film encapsulation layer 150 may include a first inorganic encapsulation layer 151, a second inorganic encapsulation layer 153 disposed on the first inorganic encapsulation layer 151, and an organic encapsulation layer 152 disposed between the first inorganic encapsulation layer 151 and the second inorganic encapsulation layer 153.

The color conversion panel 200 may be disposed on the display panel 100. The color conversion panel 200 may face the display panel 100 with both the scattering absorption layer 400 and the filling layer 300 therebetween. The color conversion panel 200 may convert light having one color provided from the display panel 100, the filling layer 300 and/or the scattering absorption layer 400, into light having another color (e.g., color-converted light) or transmit the light without color-converting the light. In an embodiment, the color conversion panel 200 may convert the third light L3 as incident light provided from the display panel 100 into the first light L1 or second light L2, or transmit the third light L3 without color-conversion. The color conversion panel 200 may include a second substrate 210, a light blocking layer 220, a color filter layer 230, a color conversion layer 250 and a bank layer 260. The light blocking layer 220 and the color filter layer 230 may be coplanar with each other and may together provide a layer on the second substrate 210 including both a light blocking pattern (e.g., the light blocking layer 220) and a color filter pattern (e.g., the color filter layer 230).

The second substrate 210 may be a transparent insulating substrate. In an embodiment, the second substrate 210 may include a material such as glass, quartz and the like. In an embodiment, the second substrate 210 may include an organic insulating material such as polyimide, polycarbonate, polyethylene terephthalate and polyacrylate.

The light blocking layer 220 may be disposed under the second substrate 210 and closer to the display panel 100 than the second substrate 210. The light blocking layer 220 may be disposed in or correspond to the non-pixel area NPA. The light blocking layer 220 may block light incident to the light blocking layer 220. Accordingly, the light blocking layer 220 may reduce or effectively prevent a mixing of color light at areas respectively between the first pixel area PA1, the second pixel area PA2 and the third pixel area PA3.

The color filter layer 230 may be disposed under the second substrate 210. The color filter layer 230 may include a first color filter 231, a second color filter 232 and a third color filter 233. The first color filter 231 may be disposed in or correspond to the first pixel area PA1, the second color filter 232 may be disposed in or correspond to the second pixel area PA2, and the third color filter 233 may be disposed in or correspond to the third pixel area PA3. The light blocking layer 220 may be disposed adjacent to and respectively between the first color filter 231, the second color filter 232 and the third color filter 233.

The color filter layer 230 may transmit light in a first wavelength band and incident to the color filter layer 230, and block light in a second wavelength band different from the first wavelength band and incident to the color filter layer 230. The first color filter 231 may transmit the first light L1 and block, for example, the second light L2 and/or the third light L3. The second color filter 232 may transmit the second light L2 and block, for example, the first light L1 and/or the third light L3. The third color filter 233 may transmit the third light L3 and block, for example, the first light L1 and/or the second light L2.

In an embodiment, the light blocking layer 220 may include a same material as the third color filter 233. Where the light blocking layer 220 includes the same material as the third color filter 233 which corresponds to the light transmission pattern 253, a specular reflection at an interface between the second substrate 210 and the light blocking layer 220 may be reduced, and accordingly, a reflection of external light in the display device 10 may be reduced.

A first protective layer 241 may be disposed under the color filter layer 230. The first protective layer 241 may reduce or effectively prevent impurities such as moisture and air from penetrating into the color filter layer 230 and/or the color conversion layer 250 from outside thereof. The first protective layer 241 may include an inorganic insulating material such as silicon oxide, silicon nitride and silicon oxynitride.

The color conversion layer 250 may be disposed under the first protective layer 241. The color conversion layer 250 may be a layer which color converts incident light, and scatters and reflects external light. The color conversion layer 250 may include a first color conversion pattern 251, a second color conversion pattern 252 and a light transmission pattern 253. The first color conversion pattern 251 may be disposed under or corresponding to the first color filter 231, the second color conversion pattern 252 may be disposed under or corresponding to the second color filter 232, and the light transmission pattern 253 may be disposed under or corresponding to the third color filter 233. In other words, the first color conversion pattern 251 may be disposed in the first pixel area PA1, the second color conversion pattern 252 may be disposed in the second pixel area PA2 and the light transmission pattern 253 may be disposed in the third pixel area PA3.

The first color conversion pattern 251 may convert light incident to the first color conversion pattern 251 into the first light L1. In an embodiment, the first color conversion pattern 251 may convert the third light L3 into the first light L1. The first color conversion pattern 251 may include a red phosphor. The red phosphor may include at least one of (Ca, Sr, Ba)S, (Ca, Sr, Ba)2Si5N8, (CaAlSiN3), CaMoO4 and Eu2Si5N8. In addition, the first color conversion pattern 251 may include a first quantum dot 251Q provided in plurality including first quantum dots 251Q. The first quantum dots 251Q may convert the third light L3 into the first light L1.

The first color conversion pattern 251 may further include a first scattering body 251S (e.g., light scattering body or light scattering member) provided in plural including first scattering bodies 251S. The first scattering bodies 251S may allow light incident to the first color conversion pattern 251 to be scattered in various directions. The first scattering bodies 251S may include metal oxide particles or organic particles. The metal oxide particles may include titanium oxide (TiO2), zirconium oxide (ZrO2), aluminum oxide (Al2O3), indium oxide (In2O3), zinc oxide (ZnO), tin oxide (SnO2) and the like, and the organic particles may include acryl-based resin, urethane-based resin and the like.

The second color conversion pattern 252 may convert light incident to the second color conversion pattern 252 into the second light L2. In an embodiment, the second color conversion pattern 252 may convert the third light L3 into the second light L2. The second color conversion pattern 252 may include a green phosphor. The green phosphor may include at least one of yttrium aluminum garnet (YAG), (Ca, Sr, Ba)2SiO4, SrGa2S4, barium magnesium aluminate (BAM), alpha sialon (α-SiAlON), beta sialon (β-SiAlON), Ca3Sc2Si3O12, Tb3Al5O12, BaSiO4, CaAlSiON and (Sr1-x)Si2O2N2. Here, x of (Sr1-xBax)Si2O2N2 may be any number between 0 and 1. In addition, the second color conversion pattern 252 may include a second quantum dot 252Q provided in plural including second quantum dots 252Q. The second quantum dots 252Q may convert the third light L3 into the second light L2.

The second color conversion pattern 252 may further include a second scattering body 252S provided in plural including second scattering bodies 252S. The second scattering bodies 252S may allow light incident to the second color conversion pattern 252 to be scattered in various directions. The second scattering body 252S included in the second color conversion pattern 252 may be substantially the same as the first scattering body 251S included in the first color conversion pattern 251.

The light transmission pattern 253 may convert and/or transmit light incident to the light transmission pattern 253 into the third light L3. In an embodiment, the light transmission pattern 253 may transmit the third light L3. The light transmission pattern 253 may include a transparent polymer material. In addition, the light transmission pattern 253 may include a third scattering body 253S provided in plural including third scattering bodies 253S. The third scattering bodies 253S may allow light incident to the light transmission pattern 253 to be scattered in various directions. The third scattering body 253S included in the light transmission pattern 253 may be substantially the same as the first scattering body 251S included in the first color conversion pattern 251 and the second scattering body 252S included in the second color conversion pattern 252.

A second protective layer 242 may be disposed under the first protective layer 241, and cover the color conversion layer 250. The second protective layer 242 may be disposed facing the first protective layer 241 with the color conversion layer 250 therebetween. The second protective layer 242 may reduce or effectively prevent impurities such as moisture and air from penetrating to the color filter layer 230 and the color conversion layer 250 from outside thereof. The second protective layer 242 may include an inorganic insulating material such as silicon oxide, silicon nitride and silicon oxynitride.

The bank layer 260 may be disposed under the second protective layer 242. The bank layer 260 may be disposed in or corresponding to the non-pixel area NPA. The bank layer 260 may be disposed respectively between the first color conversion pattern 251, the second color conversion pattern 252, and the light transmission pattern 253. The bank layer 260 may block light incident to the bank layer 260. Accordingly, the bank layer 260 may reduce or effectively prevent mixing of color light between the first pixel area PA1, the second pixel area PA2 and the third pixel area PA3.

The filling layer 300 may be disposed between the display panel 100 and the color conversion panel 200. The filling layer 300 may be disposed between the thin film encapsulation layer 150 of the display panel 100 and the second protective layer 242 of the color conversion panel 200. The filling layer 300 may serve as a buffer so that the display panel 100 and the color conversion panel 200 are stably combined to each other. That is, the display device 10 may include the filling layer 300 which is between the light emitting device 140 and the color conversion layer 250 and combines the light emitting device 140 to the color conversion layer 250. The filling layer 300 may transmit light provided from the display panel 100 to define a light transmitting layer. The filling layer 300 may include an organic material such as a silicone-based organic material, an epoxy-based organic material and an epoxy-acryl-based organic material. In an embodiment, for example, the filling layer 300 may include silicon rubber.

The scattering absorption layer 400 may be disposed between the light emitting device 140 of the display panel 100 and the color conversion layer 250 of the color conversion panel 200. In other words, the scattering absorption layer 400 may be disposed below the color conversion layer 250 and above the light emitting device 140. Light may be incident in order from the light emitting device 140 and through the filling layer 300, the scattering absorption layer 400 and the color conversion layer 250. The filling layer 300 may form an interface with each of the thin film encapsulation layer 150 of the display panel 100 and the scattering absorption layer 400, without being limited thereto. The scattering absorption layer 400 absorbs light which is scattered and reflected from the color conversion layer 250 in a direction toward the display panel 100.

In an embodiment, the scattering absorption layer 400 may include a linearly polarized layer 410 (e.g., linear polarizing layer) and a phase delay layer 420 which is disposed under and facing the linearly polarized layer 410. The linearly polarized layer 410 may be closer to the color conversion layer 250 than the phase delay layer 420, and the phase delay layer 420 may be closer to the light emitting device 140 than the linearly polarized layer 410. That is, the linear polarizing layer and the phase delay layer 420 may be in order in a direction from the color conversion panel 200 to the display panel 100.

The linearly polarized layer 410 may allow light incident to the linearly polarized layer 410 to be linearly polarized in one direction. The phase delay layer 420 may delay a phase of light incident to the phase delay layer 420 by $\lambda/4$. In an embodiment, for example, when the wavelength of light passing through the linearly polarized layer 410 and provided to the phase delay layer 420 is about 550 nanometers (nm), the light passing through the phase delay layer 420 may have a phase delay value of about 137.5 nm.

In addition, the phase delay layer 420 may have optical anisotropy, and change a polarization state of the light incident to the phase delay layer 420. In other words, the light provided to the phase delay layer 420 may be switched from a linearly polarized state to a circularly polarized state or from a circularly polarized state to a linearly polarized state. In an embodiment, the light passing through the linearly polarized layer 410 and provided to the phase delay layer 420 may be switched from a linearly polarized state to a circularly polarized state.

When external light is incident to the display device 10 through the color conversion panel 200, the external light may be scattered and reflected by the first quantum dots 251Q or the first scattering bodies 251S in the color conversion layer 250 to move toward the display panel 100. Within the display panel 100, the external light is reflected by the light emitting device 140. When the external light is reflected by the light emitting device 140 (for example, the pixel electrode 141) of the display panel 100, passes back through the color conversion panel 200 and is emitted to outside the display device 10, the reflectance of the display device 10 may increase. Accordingly, the display quality of the display device 10 may deteriorate.

However, according to one or more embodiment, the scattering absorption layer 400 as a light absorbing layer (or destructive interference layer) absorbs the light scattered and reflected from the color conversion layer 250, so that the reflection of external light in the display device 10 may be reduced or effectively prevented. When the external light is scattered and reflected by the first quantum dots 251Q or the first scattering bodies 251S in the color conversion layer 250, passes through the scattering absorption layer 400, is reflected by the light emitting device 140 (for example, the pixel electrode 141), and then passes back through the scattering absorption layer 400 again, the external light passes through the scattering absorption layer 400 twice, so that a phase of the external light may be changed. Accordingly, the phase of the reflected light reflected from the light emitting device 140 is different from the phase of the incident light incident to the scattering absorption layer 400 from the color conversion panel 200, so that a destructive interference may occur. Thus, the reflectance of the display device 10 may decrease, and the display quality of the display device 10 may be improved.

In an embodiment, the degree of polarization of the scattering absorption layer 400 may be about 10% to about 99.9%.

In an embodiment, the scattering absorption layer 400 may have a thickness 400T of about 2 micrometers (μm) to about 10 μm. When the scattering absorption layer 400 has the thickness 400T which is greater than about 10 μm, a distance between the light emitting device 140 of the display panel 100 and the color conversion layer 250 of the color conversion panel 200 may be relatively large. Accordingly, mixing of color light may occur between the first pixel area PA1, the second pixel area PA2 and the third pixel area PA3.

In an embodiment, the scattering absorption layer 400 may be disposed between the filling layer 300 and the color conversion layer 250. In an embodiment, the scattering absorption layer 400 may be provided or formed on the second protective layer 242 and the bank layer 260. The display panel 100 and the color conversion panel 200 including the scattering absorption layer 400 may be combined to each other with the filling layer 300 interposed therebetween.

In an embodiment, the scattering absorption layer 400 may overlap the first to third pixel areas PA1, PA2 and PA3. In an embodiment, the scattering absorption layer 400 may absorb the external light scattered and reflected from each of the first color conversion pattern 251, the second color conversion pattern 252 and the light transmission pattern 253.

Figure 4:
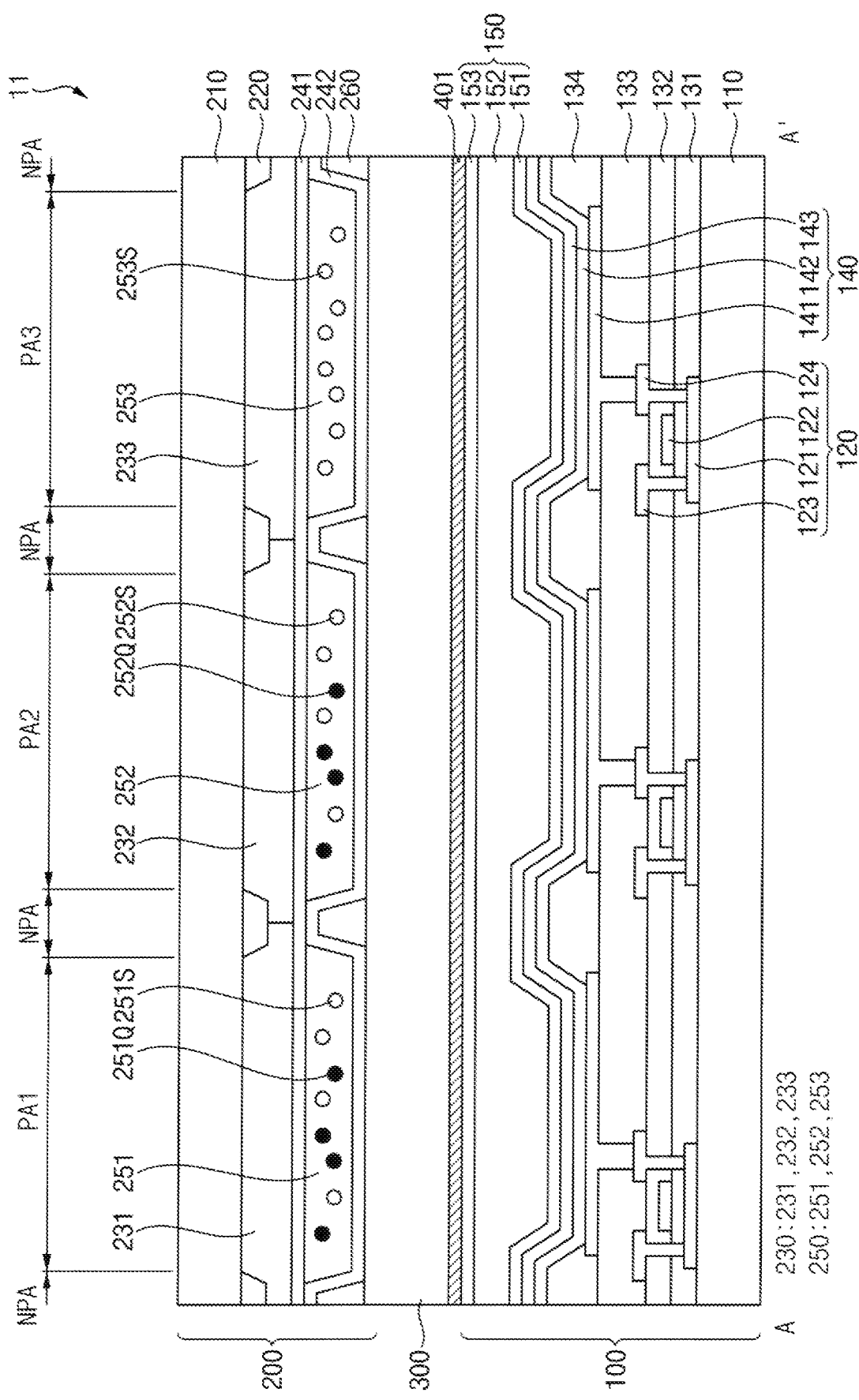
FIG. 4 is a cross-sectional view showing an embodiment of a display device.

FIG. 4 is a cross-sectional view showing an embodiment of a display device 11.

The display device 11 described with reference to FIG. 4 may be substantially the same as or similar to the display device 10 described with reference to FIGS. 1 to 3, except for the position of a scattering absorption layer 401. Accordingly, the description of the redundant configurations will be omitted.

In an embodiment, the scattering absorption layer 401 may be disposed between the thin film encapsulation layer 150 and the filling layer 300. In an embodiment, the scattering absorption layer 401 may be provided or formed on the thin film encapsulation layer 150. The display panel 100 including the scattering absorption layer 401 may be combined to the color conversion panel 200 with the filling layer 300 interposed therebetween. In an embodiment, the scattering absorption layer 401 may be considered a portion of the display panel 100, without being limited thereto.

Figure 5:
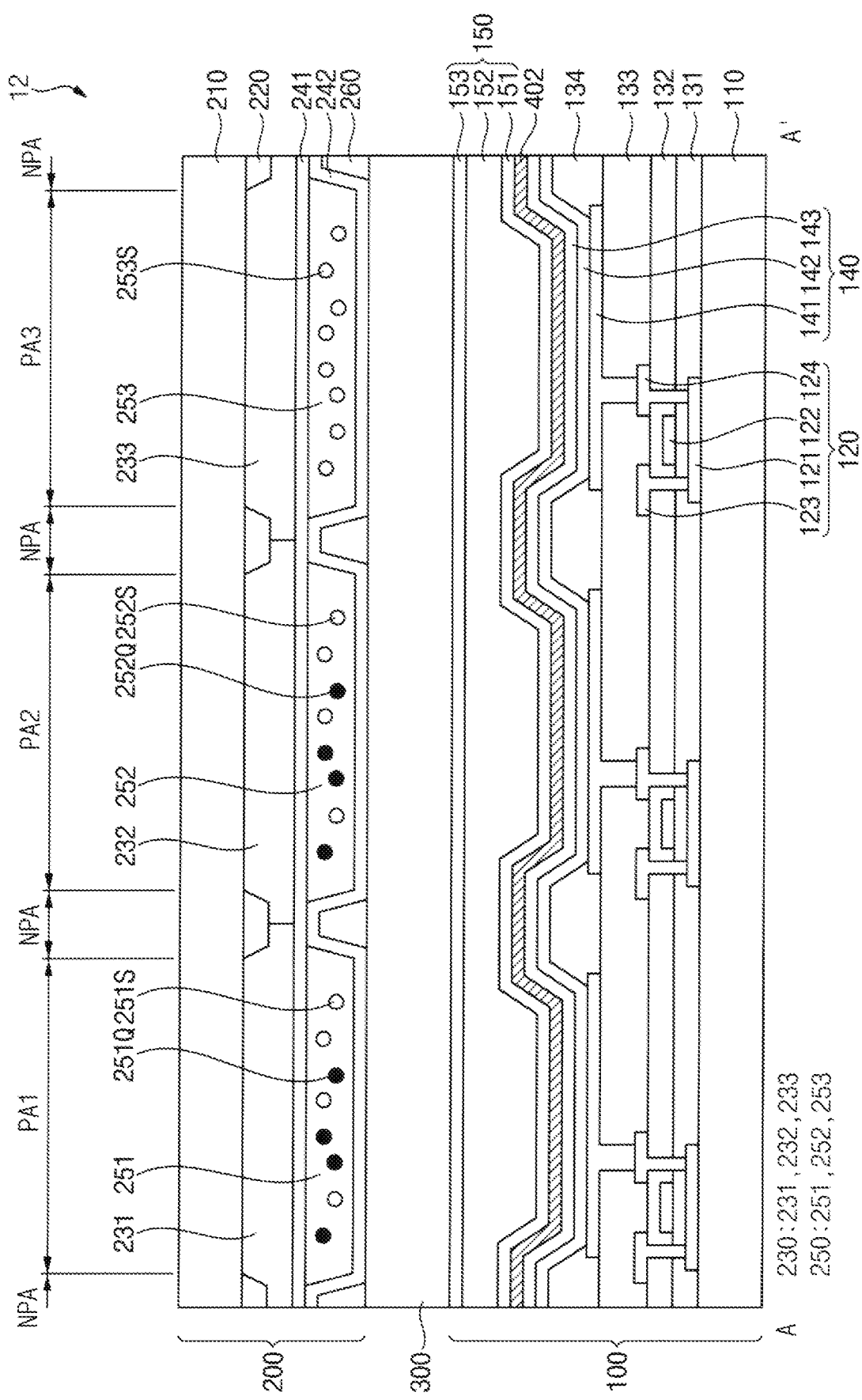
FIG. 5 is a cross-sectional view showing an embodiment of a display device.

FIG. 5 is a cross-sectional view showing an embodiment of a display device 12.

The display device 12 described with reference to FIG. 5 may be substantially the same as or similar to the display device 10 described with reference to FIGS. 1 to 3, except for the position of a scattering absorption layer 402. Accordingly, the description of the redundant configurations will be omitted.

In an embodiment, within the display panel 100, the scattering absorption layer 402 may be disposed between the light emitting device 140 and the thin film encapsulation layer 150. In an embodiment, the scattering absorption layer 402 may be provided or formed on the counter electrode 143, and the thin film encapsulation layer 150 may be provided or formed on the scattering absorption layer 402. That is, within the display panel 100, the light emitting device 140, the scattering absorption layer 402 and the thin film encapsulation layer 150 may be in order in a direction from the display panel 100 to the color conversion panel 200.

Figure 6:
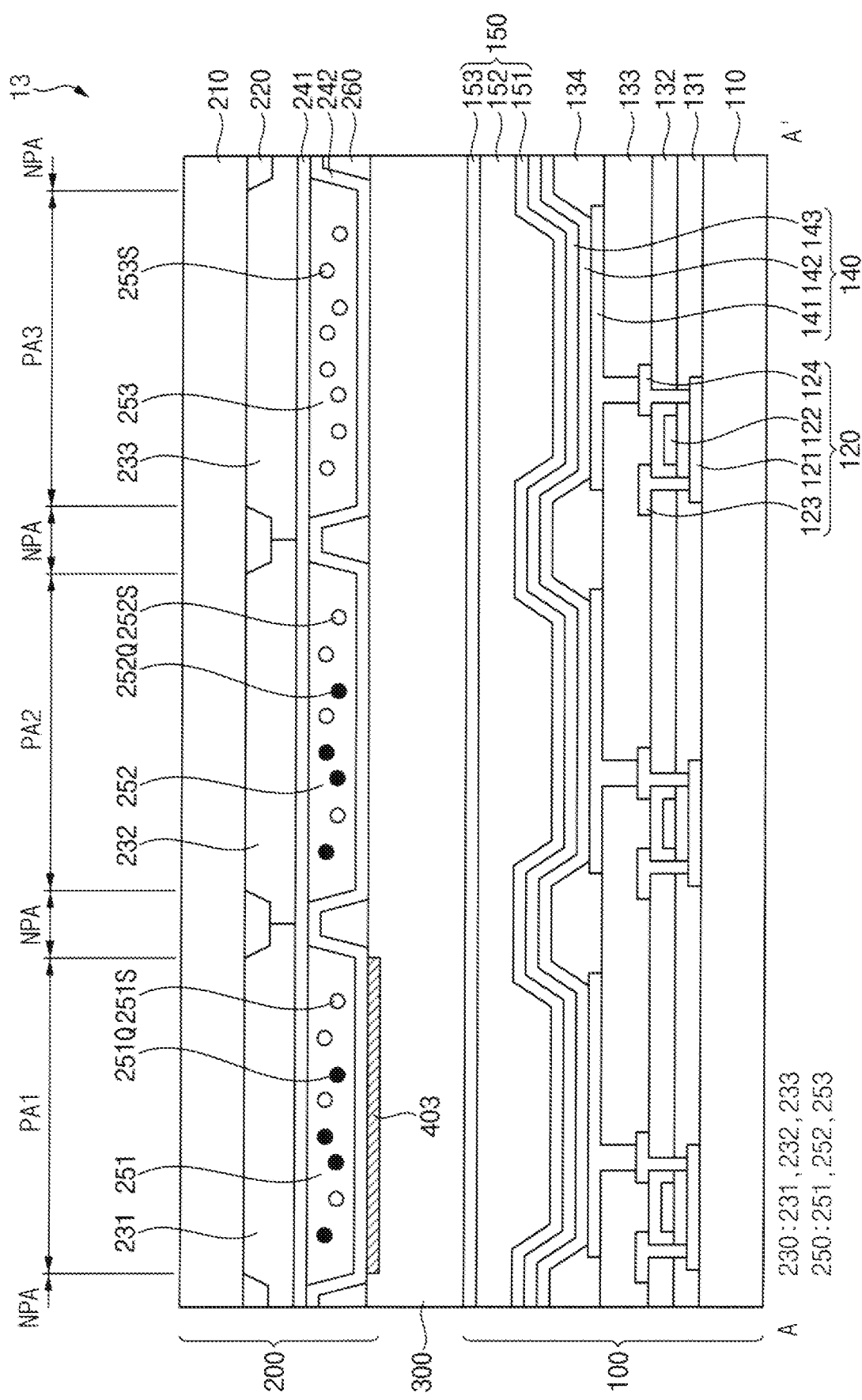
FIG. 6 is a cross-sectional view showing an embodiment of a display device.

FIG. 6 is a cross-sectional view showing an embodiment of a display device 13.

The display device 13 described with reference to FIG. 6 may be substantially the same as or similar to the display device 10 described with reference to FIGS. 1 to 3, except for the position of a scattering absorption layer 403. Accordingly, the description of the redundant configurations will be omitted.

In an embodiment, the scattering absorption layer 403 may overlap or correspond to the first pixel area PA1, and may not overlap or correspond to the second pixel area PA2 or the third pixel area PA3. The degree in which external light incident to the first color conversion pattern 251 including the first quantum dots 251Q is scattered and reflected from the first color conversion pattern 251 may be greater than the degree in which external light incident to the light transmission pattern 253 not including a quantum dot is scattered and reflected from the light transmission pattern 253. Accordingly, the scattering absorption layer 403 is selectively provided or formed to overlap or correspond to the first pixel area PA1, so that the external light reflection due to the external light incident to the first color conversion pattern 251 may decrease. The scattering absorption layer 403 is selectively provided or formed may be a scattering absorption pattern.

Figure 7:
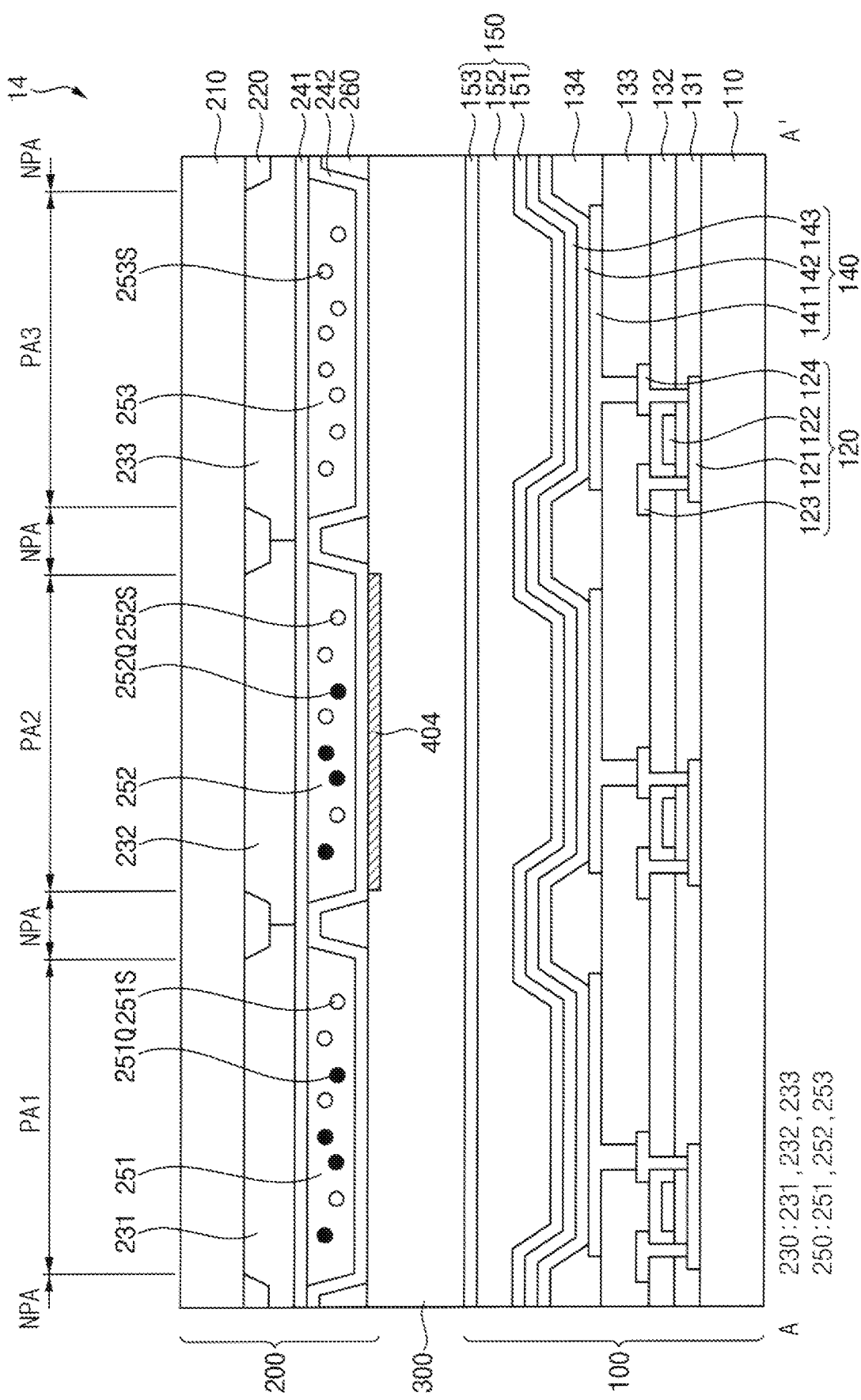
FIG. 7 is a cross-sectional view showing an embodiment of a display device.

FIG. 7 is a cross-sectional view showing an embodiment of a display device 14.

The display device 14 described with reference to FIG. 7 may be substantially the same as or similar to the display device 10 described with reference to FIGS. 1 to 3, except for the position of a scattering absorption layer 404. Accordingly, the description of the redundant configurations will be omitted.

In an embodiment, the scattering absorption layer 404 may overlap or correspond to the second pixel area PA2, and may not overlap the first pixel area PA1 or the third pixel area PA3. The degree in which external light incident to the second color conversion pattern 252 including the second quantum dots 252Q is scattered and reflected from the second color conversion pattern 252 may be greater than the degree in which external light incident to the light transmission pattern 253 not including a quantum dot is scattered and reflected from the light transmission pattern 253. Accordingly, the scattering absorption layer 403 is selectively provided or formed to overlap or correspond to the second pixel area PA2, so that the external light reflection due to the external light incident to the second color conversion pattern 252 may decrease.

Figure 8:
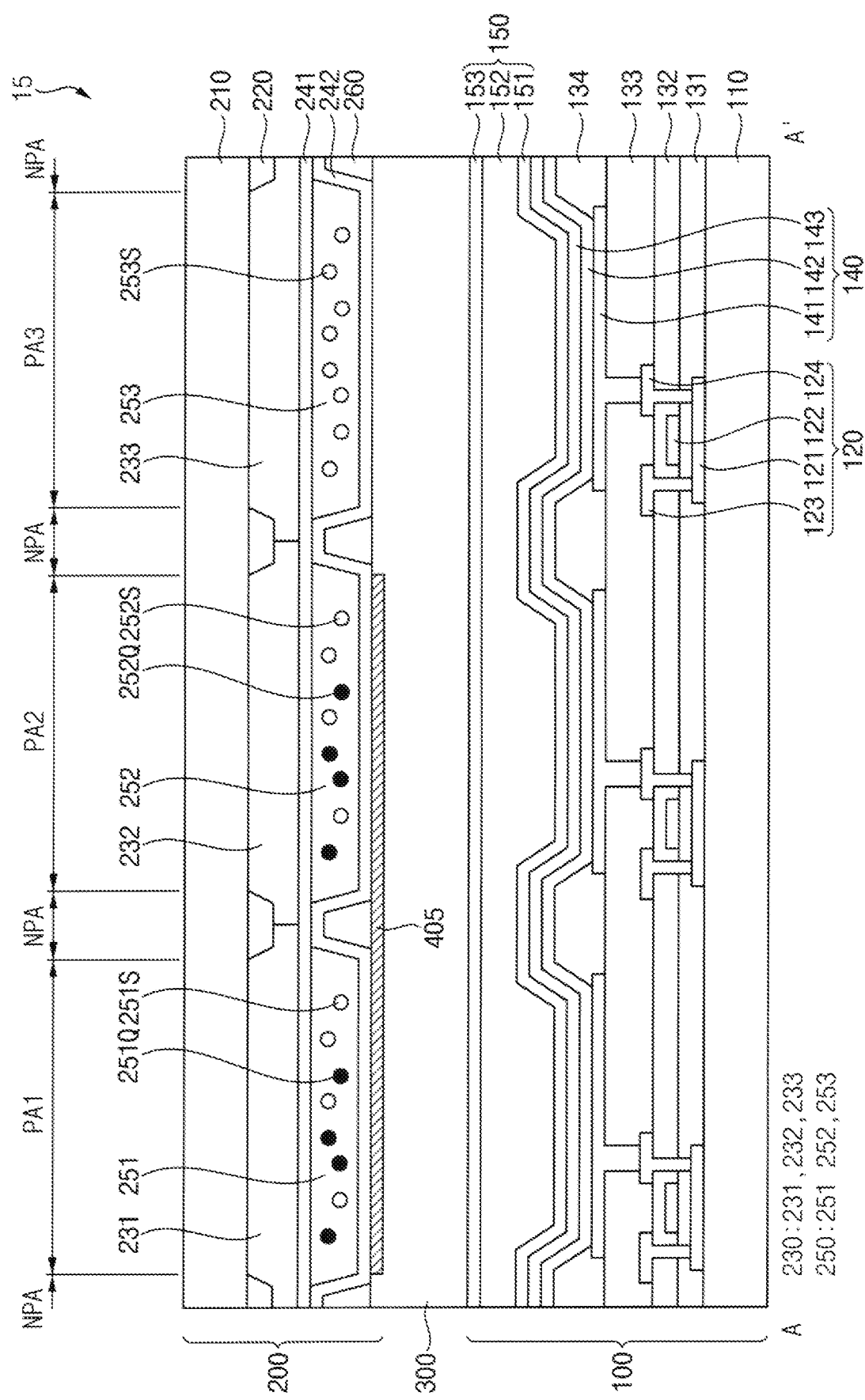
FIG. 8 is a cross-sectional view showing an embodiment of a display device.

FIG. 8 is a cross-sectional view showing an embodiment of a display device 15.

The display device 15 described with reference to FIG. 8 may be substantially the same as or similar to the display device 10 described with reference to FIGS. 1 to 3, except for the position of a scattering absorption layer 405. Accordingly, the description of the redundant configurations will be omitted.

In an embodiment, the scattering absorption layer 405 as a single pattern may commonly overlap both the first pixel area PA1 and the second pixel area PA2, and may not overlap the third pixel area PA3. The degree in which external light incident to the first color conversion pattern 251 including the first quantum dots 251Q is scattered and reflected from the first color conversion pattern 251, and the degree in which external light incident to the second color conversion pattern 252 including the second quantum dots 252Q is scattered and reflected from the second color conversion pattern 252 may each be greater than the degree in which external light incident to the light transmission pattern 253 not including a quantum dot is scattered and reflected from the light transmission pattern 253. Accordingly, the scattering absorption layer 405 is selectively provided or formed to overlap the first pixel area PA1 and the second pixel area PA2, so that the external light reflection due to the external light incident to the first color conversion pattern 251 and the second color conversion pattern 252 may decrease.

One or more embodiment of the display device 10 may be applied to a computer, a notebook, a mobile phone, a smartphone, a smart pad, a persona media player ("PMP"), a personal digital assistant ("PDA"), an MP3 player, or the like.

Although embodiments of the color conversion panel 200 and the display device 10 have been described with reference to the drawings, the illustrated embodiments are examples, and may be modified and changed by a person having ordinary knowledge in the relevant technical field without departing from the technical spirit described in the following claims.

What is claimed is:

1. A color conversion panel comprising:
   a pixel area provided in plural comprising a plurality of pixel areas including a first pixel area and a second pixel area adjacent to each other in a first direction;
   a non-pixel area adjacent to the pixel area along the first direction;
   a light blocking layer in the non-pixel area, the light blocking layer including light blocking patterns which are spaced apart from each other and respectively define the plurality of pixel areas therebetween;
   a color filter layer including a first color filter in the first pixel area and a second color filter in the second pixel area;
   a color conversion layer which color converts incident light, and scatters and reflects external light, the color conversion layer including a first color conversion pattern corresponding to the first color filter and a light transmission pattern corresponding to the second color filter; and
   a light absorbing layer including a linearly polarizing layer and a phase delay layer which are entirely below both the color filter layer and the color conversion layer,
   wherein the light absorbing layer continuously extends from the non-pixel area and into the pixel area along the first direction, faces the first color conversion pattern of the color conversion layer within the pixel area, does not overlap the light transmission pattern of the color conversion layer and absorbs light which is scattered and reflected from the color conversion layer.

2. The color conversion panel of claim 1, wherein the light absorbing layer further includes in order from the color conversion layer:
   the linearly polarizing layer, and
   the phase delay layer.

3. The color conversion panel of claim 1, wherein
   the plurality of pixel areas further comprises the first pixel area, a third pixel area and the second pixel area arranged in order along the first direction, and
   the first pixel area, the third pixel area and the second pixel area include a red pixel area, a green pixel area and a blue pixel area, respectively.

4. The color conversion panel of claim 3, wherein the light absorbing layer continuously extends from the non-pixel area to overlap the first pixel area including the red pixel area, and does not overlap each of the third pixel area including the green pixel area and the second pixel area including the blue pixel area along the first direction.

5. The color conversion panel of claim 3, wherein the light absorbing layer continuously extends from the non-pixel area to overlap the third pixel area including the green pixel area, and does not overlap the first pixel area including the red pixel area and the second pixel area including the blue pixel area along the first direction.

6. The color conversion panel of claim 3, wherein the light absorbing layer continuously extends from the non-pixel area to overlap both the first pixel area including the red pixel area and the third pixel area including the green pixel area, and does not overlap the second pixel area including the blue pixel area along the first direction.

7. The color conversion panel of claim 1, wherein the light absorbing layer has a degree of polarization of about 10% to about 99.9%.

8. The color conversion panel of claim 1, wherein the light absorbing layer has a thickness of about 2 micrometers to about 10 micrometers.

9. The color conversion panel of claim 1, wherein
the light blocking layer and the second color filter which corresponds to the light transmission pattern each includes a material, and
the material of the light blocking layer is the same as the material of the second color filter.

10. A display device comprising:
a pixel area provide in plural comprising a plurality of pixel areas including a first pixel area and a second pixel area adjacent to each other along a first direction;
a non-pixel area adjacent to the pixel area along the first direction;
a light emitting device in each of the first pixel area and the second pixel area;
a color conversion layer which color converts incident light, and scatters and reflects external light, the color conversion layer including a first color conversion pattern corresponding to the first pixel area and a light transmission pattern corresponding to the second pixel area;
a color filter layer including a first color filter corresponding to the first color conversion pattern and a second color filter corresponding to the light transmission pattern;
a light blocking layer in the non-pixel area, the light blocking layer including light blocking patterns which are spaced apart from each other and respectively define the plurality of pixel areas therebetween; and
a light absorbing layer including a linearly polarizing layer and a phase delay layer which are entirely between the light emitting device and each of the color conversion layer and the color filter layer, respectively,
wherein the light absorbing layer continuously extends from the non-pixel area and into the pixel area along the first direction, does not overlap the light transmission pattern of the color conversion layer, and absorbs light scattered and reflected from the color conversion layer.

11. The display device of claim 10, wherein the light absorbing layer further includes in order from the light emitting device to the color conversion layer:
the phase delay layer, and
the linearly polarizing layer.

12. The display device of claim 10, further comprising a filling layer which is between the light emitting device and the color conversion layer and combines the light emitting device to the color conversion layer,
wherein the light absorbing layer is between the filling layer and the color conversion layer.

13. The display device of claim 10, further comprising:
a filling layer which is between the light emitting device and the color conversion layer and combines the light emitting device to the color conversion layer, and
a thin film encapsulation layer which is between the filling layer and the light emitting device,
wherein the light absorbing layer is between the thin film encapsulation layer and the filling layer.

14. The display device of claim 10, further comprising a thin film encapsulation layer between the light emitting device and the color conversion layer,
wherein the light absorbing layer is between the light emitting device and the thin film encapsulation layer.

15. The display device of claim 10, wherein
the plurality of pixel areas further comprises the first pixel area, a third pixel area and the second pixel area arranged in order along the first direction, and
the first pixel area, the third pixel area and the second pixel area include a red pixel area, a green pixel area and a blue pixel area, respectively.

16. The display device of claim 15, wherein the light absorbing layer continuously extends from the non-pixel area to overlap the first pixel area including the red pixel area, and does not overlap each of the third pixel area including the green pixel area and the second pixel area including the blue pixel area along the first direction.

17. The display device of claim 15, wherein the light absorbing layer continuously extends from the non-pixel area to overlap the third pixel area including the green pixel area, and does not overlap the first pixel area including the red pixel area and the second pixel area including the blue pixel area along the first direction.

18. The display device of claim 15, wherein the light absorbing layer continuously extends from the non-pixel area to overlap both the first pixel area including the red pixel area and the third pixel area including the green pixel area, and does not overlap the second pixel area including the blue pixel area along the first direction.

19. The color conversion panel of claim 6, wherein the light absorbing layer further continuously extends across a portion of the non-pixel area which is between the first pixel area including the red pixel area and the third pixel area including the green pixel area.

* * * * *